United States Patent [19]

Satoh

[11] Patent Number: 4,746,860

[45] Date of Patent: May 24, 1988

[54] MAGNETIC RESONANCE IMAGING SYSTEM

[75] Inventor: Kozo Satoh, Yokohama, Japan

[73] Assignee: Kabushiki Kaisha Toshiba, Kawasaki, Japan

[21] Appl. No.: 31,132

[22] Filed: Mar. 30, 1987

[30] Foreign Application Priority Data

Mar. 31, 1986 [JP] Japan ................................ 61-72921

[51] Int. Cl.$^4$ ............................................. G01R 33/20
[52] U.S. Cl. ..................................... 324/309; 324/307
[58] Field of Search ............... 324/300, 307, 309, 313, 324/314, 318, 322; 128/653

[56] References Cited

U.S. PATENT DOCUMENTS

| | | | |
|---|---|---|---|
| 4,471,305 | 9/1984 | Crooks et al. | 324/309 |
| 4,567,893 | 2/1986 | Charles et al. | 128/653 |
| 4,663,591 | 5/1987 | Pelc et al. | 324/309 |
| 4,665,365 | 5/1987 | Glover et al. | 324/309 |

FOREIGN PATENT DOCUMENTS 61-45744  3/1986  Japan .
8417290  1/1986  United Kingdom .

OTHER PUBLICATIONS

SMRM Preprint P. 962 Philips Medical Systems; J. J. M. Cuppen et al.
(4th SMRM Preprint P. 948) Breather, A Method for Passive Reduction of Respiratory Motion-Induced "Ghost" Artifacts in MR Imaging Using Breathing Synchronization (U.S.P. No. 4,567,893).
(4th SMRM Preprint P. 939) Respiratory Ordered Phase Encoding (ROPE) (United Kingdom Patent Application No. 8,417,290).

Primary Examiner—Michael J. Tokar
Attorney, Agent, or Firm—Oblon, Fisher, Spivak, McClelland & Maier

[57] ABSTRACT

In a magnetic resonance imaging system, a radio frequency field for exciting a magnetic resonance phenomenon, a first gradient field for determining a image slice, a second gradient field for phase-encoding, and a third gradient field for reading out an echo signal of the magnetic resonance, are applied to a subject in the static field. Thus, the echo signal is acquired, and image reconstruction data is obtained from the echo signal, whereby reconstructed image information is obtained. A correction data generating section uses the second gradient field as a gradient field for reading out the echo signal, and applies the first and second gradient fields, and the radio frequency field to the subject in the static field, in accordance with a predetermined sequence, without applying a gradient field for phase-encoding, and acquires the echo signal, so as to obtain correction data corresponding to the image reconstruction data along an encoding axis. A correcting section corrects the image reconstruction data, using the correction data.

15 Claims, 6 Drawing Sheets

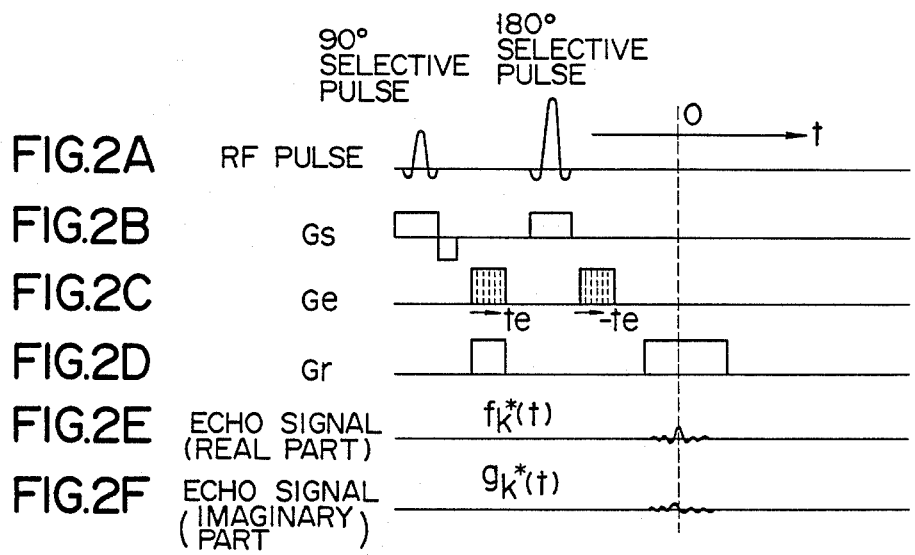
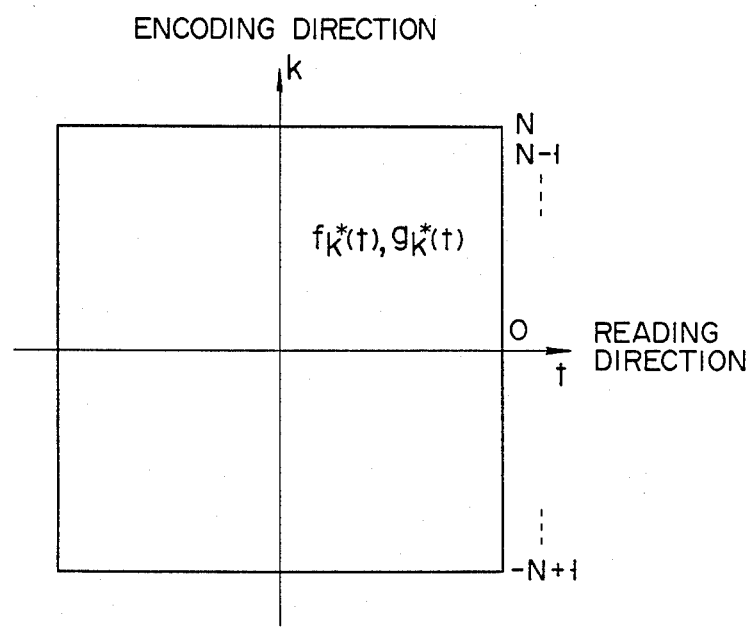

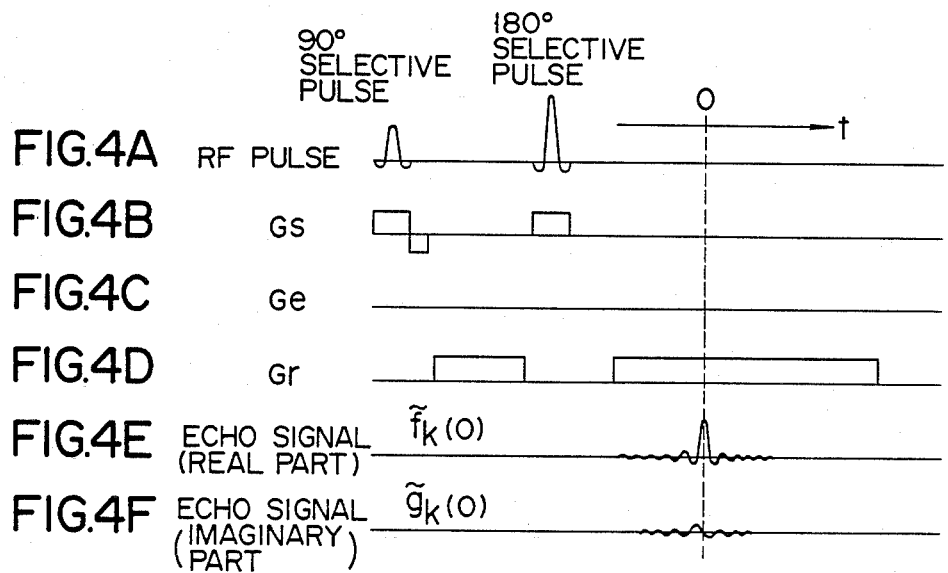
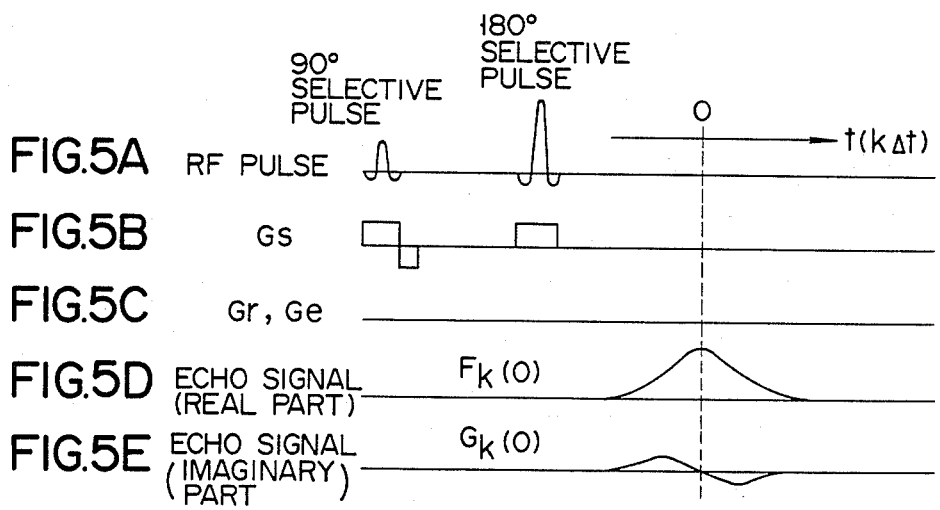

F I G. 8
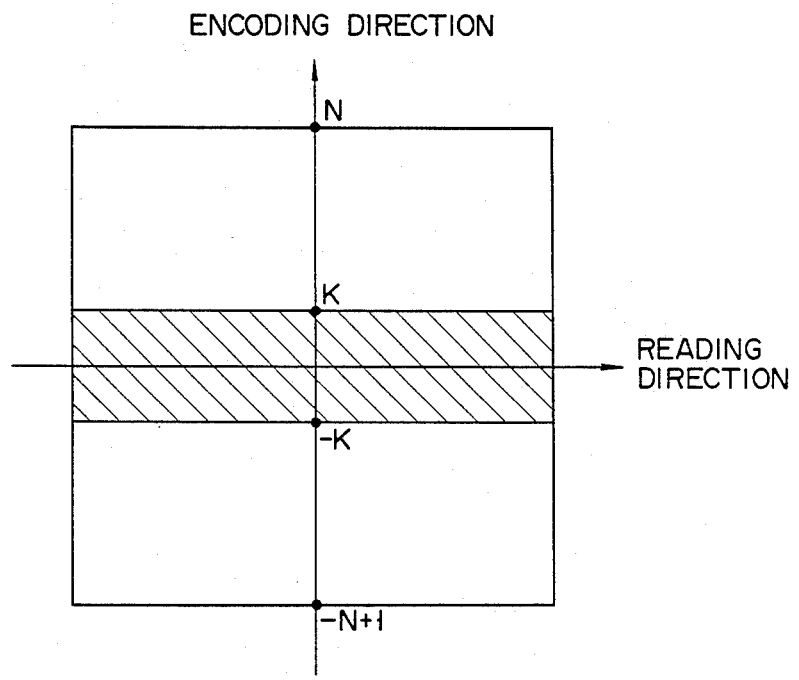

MAGNETIC RESONANCE IMAGING SYSTEM

BACKGROUND OF THE INVENTION

The present invention relates to a magnetic resonance imaging (MRI) system and, more particularly, to an MRI system which can eliminate or remove degradation in image quality caused by a respiratory movement, cardiac cycles, and other body movement of a subject under medical examination; for example, degradation in image quality caused by a ghost-like artifact.

As is already known, the magnetic resonance imaging (MRI) technique utilizes a magnetic resonance phenomenon to obtain chemical and physical microscopic information of molecules. Using this phenomenon, the energy of an RF magnetic field, which is rotated at a specific frequency in a plane perpendicular to the direction of a static magnetic field, is resonantly absorbed when a group of nuclear spins unique to specific atomic nuclei, which have magnetic moments, is placed in a uniform static magnetic field.

By using the MRI technique, the spatial distribution of specific atomic nuclei, for example, hydrogen atomic nuclei (contained in water and fat), can be visualized. As examples of MRI methods, a projection reconstruction method by Lauterbur, a Fourier transformation (FT) method by Kumar, Welti, Ernst, a spin warp method by Hutchison et al. as a modification of the FT method, an echo planar method by Mansfield, and the like are known.

Some MRI systems are capable of performing high-speed imaging, (for example, a system using the echo planar method) wherein all the image-reconstruction data can be acquired within several tens of milliseconds. However, in MRI systems other than those which can perform such high-speed imaging, the data acquisition time is long, in the order of minutes. For this reason, degradation in image quality caused by body movements, for example, degradation in image quality due to a ghost-like artifact and/or blurring, caused by body movement, tends to occur with respect to images of internal organs other than regions such as the central nervous system, the pelvic region, the legs and arms, and the like, which are less influenced by body movements. In particular, degradation in image quality tends to occur with respect to images of such regions as the thorax and the abdominal region which are influenced considerably by body movement such as respiratory movement and/or cardiac cycles. Such degradation in image quality is caused since the phase and amplitude of image reconstruction data (which is obtained by detecting a magnetic resonance (MR) signal) cause semi-periodical variations in the direction of the encoding axis (of phase-encoding for providing positional information to the MR signal) due to semi-periodical body movement such as respiratory movement and/or cardiac cycles.

Known methods for suppressing such degradation in image quality include (1) a method wherein a subject being examined is fastened by a band so as to forcibly suppress body movement, (2) a method wherein respiratory movement is monitored, and expansion and contraction caused by respiration are corrected by controlling the intensity of a gradient field or by software processing, (3) a method wherein an encoding order is reordered to differ from that of the normal method, so as to apparently delay the body movement cycle, and the like.

Method (1) is effective in some cases. However, it applies a physical load to the subject, and causes pain and discomfort to the subject (i.e., the patient). In methods (2) and (3), respiratory movement must be monitored, the intensity of the gradient field must be controlled, and complex processing of software is required. The system using method (2) or (3) is therefore complicated, and is not versatile. Method (2) is based on the assumption that body movement, i.e., the extraction and contraction, occurs linearly in the direction of a gradient field used for encoding or reading data. The actual body movement is much different from such linear movement. In view of this, method (2) can be said to be imcomplete.

An artifact caused by blood flow can be considered as one of those caused by body movement. None of methods (1) to (3) are effective to counter the effects of this particular body movement.

As has been described above, in MRI systems using the conventional FT or spin warp method, it is difficult to easily and effectively eliminate degradation in image quality caused by the body movement of a subject under examination.

SUMMARY OF THE INVENTION

The present invention has been conceived to solve the problems associated with the prior art, and has as its object to provide an MRI system which can effectively eliminate or remove degradation in image quality caused by the various types of body movement of a subject under examination, by way of a technique which can be easily attained without the need to impose any form of physical load or to cause pain and discomfort to the subject.

The MRI system of the invention is designed to acquire echo signals resulting from the magnetic resonance in a subject and to obtain, from the echo signals, image reconstruction data by the FT method, the spin-warp method, or any other similar imaging method. In order to achieve the above object, a gradient field identical with the encoding gradient field, which is used to collect the image reconstruction data, is applied as a reading gradient field to the subject, but the encoding gradient field is not applied, thereby collecting echo signals. The data corresponding to the value found on a encoding axis of the image reconstruction data is obtained from the echo signals thus collected. This data is used as correction data to correct the phase and amplitude of the image reconstruction data.

According to the MRI system of the present invention, either data in the image reconstruction data which corresponds to a value along the encoding axis, or appropriately processed data of such data can be used as the aforementioned correction data. Using the correction data, variations in the phase and amplitude of the image reconstruction data, caused by body movement, can be suppressed, and degradation in image quality caused by the body movement—for example, degradation in image quality caused by a ghost-like artifact and/or blurring—can be reduced or eliminated.

Furthermore, according to the MRI system of the present invention, when using an image reconstruction method such as the FT or spin-warp method, which requires a relatively long period of time for image reconstruction data acquisition, variations in the phase and amplitude of image reconstruction data, influenced by such body movement as respiratory movement and/or cardiac cycles, can be suppressed. Therefore, degradation in image quality caused by body movement can be eliminated or removed, thereby permitting a good quality reconstruction image to be obtained.

BRIEF DESCRIPTION OF THE DRAWINGS

FIGS. 2A to 2F are timing charts showing pulse sequences for image reconstruction by means of the FT method;

FIG. 3 is a view showing the location of image reconstruction data in the Fourier space, obtained by the FT method;

FIGS. 4A to 4F are timing charts for explaining procedures for correction data acquisition in the system according to the first embodiment of the present invention;

FIGS. 5A to 5E are timing charts for explaining procedures for acquiring data used for correcting attenuation in correction data, caused by nonuniformity of a magnetic field;

FIG. 8 is a diagram explaining the operation of an MRI system according to a second embodiment of the invention, and more precisely, showing a zero-encode adjacent region in which the number of accumulations used to find an arithmetic mean in the Fourier space increases in order to reduce a ghost-like artifact caused by the movement of a subject.

DETAILED DESCRIPTION OF THE PREFERRED EMBODIMENTS

Figure 1:
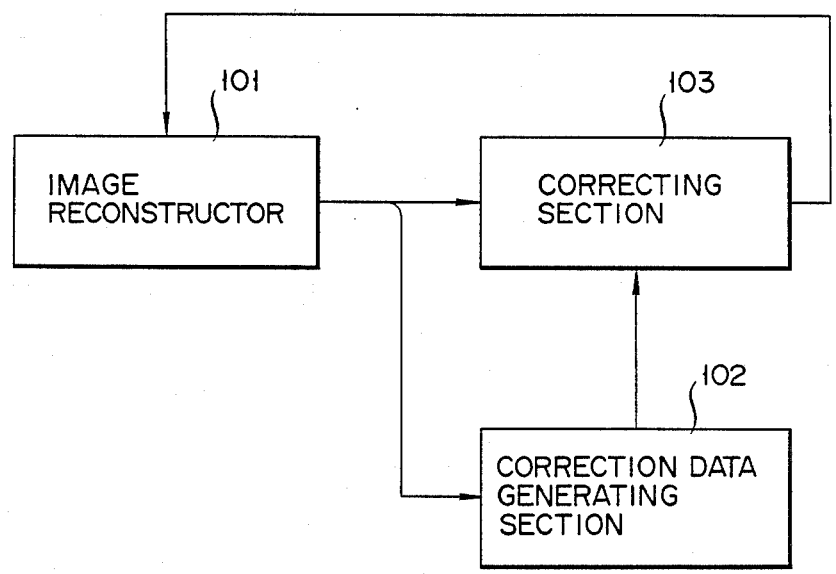
FIG. 1 is a block diagram showing a basic arrangement of an MRI system, for explaining the principle of the system according to a first embodiment of the present invention.

FIG. 1 shows the basic arrangement of an MRI system, for explaining the principle of the MRI system according to a first embodiment of the present invention. The MRI system according to the first embodiment of the present invention comprises image reconstructor 101, correction data generating section 102, and correcting section 103.

Image reconstruction data from image reconstructor 101 is supplied to correcting section 103, and the phase and amplitude of the image reconstruction data are corrected with reference to correction data produced by correction data generating section 102, as will be described later.

Correction data generating section 102 applies a gradient field as a read gradient field to a subject, but does not apply the encoding gradient field to the subject. This field applied to the subject is identical with the encoding gradient field which is used to obtain the image reconstruction data by, for example, the FT method or the spin-warp method. Section 102 collects echo signals resulting from the magnetic resonance occurring within the subject. Section 102 then obtain, from the echo signals, the data corresponding to the value found on a encoding axis of the image reconstruction data. This data is directly output from section 102 as correction data to correcting section 103. Alternatively, it is processed within section 102 before being supplied to correction section 103.

Correction section 103 obtains the ratio of the correction data to the value included in the image reconstruction data and corresponding to the value found on the encoding axis. Section 103 then multiplies this ratio by the image reconstruction data, thereby correcting the image reconstruction data. The corrected image reconstruction data from section 103 is supplied to image reconstructor 101. Using the corrected image reconstruction data, image reconstructor 101 reconstructs the resulting image.

The above-mentioned correction method will now be described in more detail. Using the normal FT method, as shown in FIGS. 2A to 2F, application time te of phase-encoding gradient field Ge is changed in units of given time width $\Delta t$ to yield $te=k\Delta t$ (where $-N+1 \leq k \leq N$, and 2N is the size of an image matrix), and read gradient field Gr is applied at a timing shown in FIG. 2D for each k, so as to acquire echo signals, thereby obtaining image reconstruction data. The image reconstruction data is acquired in the order of $-N+1$, $-N+2, \ldots, N-1, N$, as is shown in FIG. 3. In order to obtain all the image reconstruction data by this method, a long period of time in the order of minutes is required. The subject cannot keep still for such a long period of time, and the amplitude and phase of the image reconstruction data which is being obtained, will inevitably vary. As has been described, this variation will eventually cause problems such as a ghost-like artifact, thus degrading the quality of the resulting image.

In this system, in order to suppress variations in the amplitude and phase of image reconstruction data, prior to the acquisition thereof, (for example, acquisition of image reconstruction data based on the FT method as shown in FIGS. 2A to 2F) a gradient field corresponding to phase encoding gradient field Ge is used as read gradient field Gr, echo signals being acquired without applying phase-encoding gradient field Ge. In this case, the intensity of read gradient field Gr is set to be equal to that of phase-encoding gradient field Ge used when image reconstruction data is acquired, and an echo signal-sampling interval is set to be equal to time width $\Delta t$ for encoding. In general, the product of Ge and $\Delta t$ can be the same value upon acquisition of image reconstruction data.

The acquired echo signal data is given by:

$$\bar{f}k(0)+i\bar{g}k(0) \tag{1}$$

and is used as correction data. The echo signal data is obtained by quadrature-detecting the echo signals, and its real part is expressed by $\bar{f}k(0)$, its imaginary part being expressed by $\bar{g}k(0)$. It can be easily understood that the echo signal data corresponds to data in image reconstruction data along the encoding axis. If the image reconstruction data is expressed by:

$$f^*k(t)+ig^*k(t) \quad (-N+1 \leq k \leq N) \tag{2}$$

this ideally yields:

$$\tilde{f}^*k(0)+ig^*k(0)=\bar{f}k(0)+i\bar{g}k(0) \tag{3}$$

However, equation (3) can be established only when there is no error in the phase and amplitude of the image reconstruction data, due to body movement and the like. In general, the right and left sides of equation (3) (i.e., formulas (1) and (2)) are not equal to each other. More specifically, in general, formula (2) is expressed by:

$$\bar{f}^*k(0)+i\bar{g}^*k(0) = ak \cdot exp(i\phi k)(\widetilde{fk}(0)+i\widetilde{gk}()\}$$ (4)

where ak is an error in amplitude and $\phi k$ is a phase error.

If the ratio of the value of correction data to a value in image reconstruction data along the encoding axis is given as:

$$Zk = 1/ak \cdot exp(i\phi k)$$
$$= \{fk(0) + igk(0)\}/\{f^*k(0) + ig^*k(0)\}$$ (5)

image reconstruction data fk(t)+igk(t), from which an error in phase and amplitude due to body movements is removed, can be obtained by:

$$\widetilde{fk}(t)+i\widetilde{gk}(t)=Zk\{f^*k(t)+ig^*k(t)\}$$ (6)

From this corrected image reconstruction data, a reconstructed image, i.e., distribution information of specific atomic nuclei in a given slice of the subject, can be obtained by normal two-dimensional Fourier transformation.

Acquired echo signal data $\widetilde{fk}(0)+i\widetilde{gk}(0)$ is usually attenuated since the magnetic field is not uniform in intensity in most cases. This attenuation is disregarded during the above-mentioned correction processing. When the correction processing is being performed, the attenuation is present in the reading direction, though not in the encoding direction. The attenuation present in the reading direction must be eliminated if it adversely influences the correction processing. To this end, the correction data is corrected.

In order to eliminate said attenuation, thereby to correct the image-correction data, the measures illustrated in FIGS. 5A to 5E are taken. Echo signals are collected, without applying encoding gradient field Ge or reading gradient field Gr to the subject. Correction data $\widetilde{fk}(0)+i\widetilde{gk}(0)$, which corresponds to the value found on the encoding axis, is corrected by the amplitude normalized by using the peak value of the echo signals as 1. The correction data, thus corrected, is used to correct the image reconstruction data.

More specifically, echo signal data obtained without applying gradient fields Ge and Gr is given by:

$$Fk(0)+iGk(0)$$ (7)

Note that the sampling time interval of this echo signal data is set to be a value corresponding to $\Delta t$, upon image reconstruction data acquisition. In this case, if $$Ak=\{\bar{F}0(0)+i\bar{G}0(0)\}/\{(Fk(0)+i\bar{G}x(0)\}$$ (8)

correction data fk(0)+igk(0), from which the attenuation effect arising from the influence of nonuniformity of the magnetic field is removed, can be obtained by:

$$fk(0)+igk(0)=Ak\{\widetilde{fk}(0)+i\widetilde{gk}(0)\}$$ (9)

Figure 6:
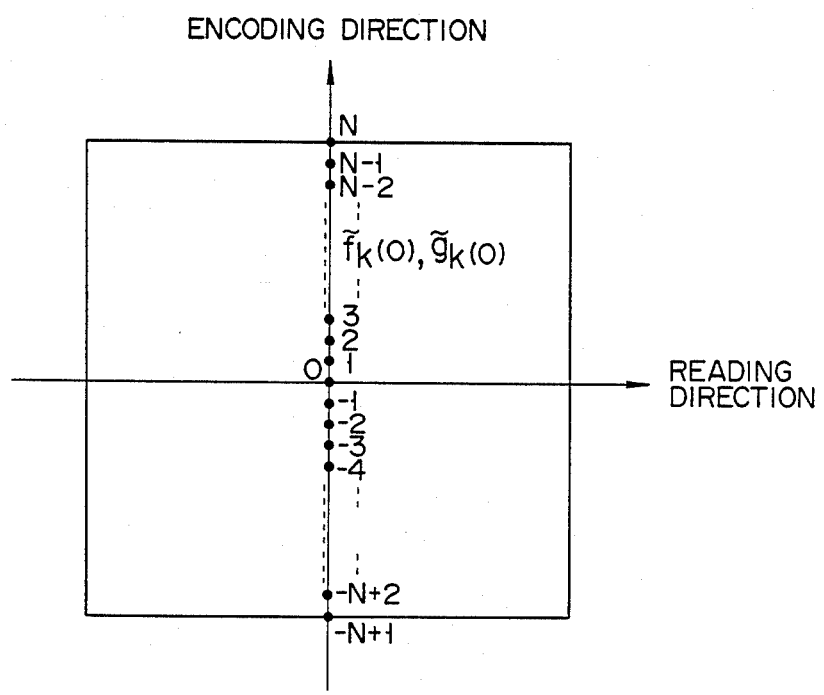
FIG. 6 is a view showing the location of the correction data in the Fourier space.

The correction data can suitably correspond to a value in the image reconstruction data along the encoding axis shown in FIG. 6. Note that upon correction of the correction data, $|Ak|$ can be used instead of Ak in some cases.

Since the above-mentioned correction processing includes division operations, as shown in equations (5) and (8), if the S/N ratios of the denominators of these equations are low, the appropriate correction data cannot be obtained, due to mathematical instability. If such inappropriate correction data is used, degradation in the image S/N ratio or generation of a new artifact will occur.

In order to prevent such a problem from occurring, the following countermeasures (1) and (2) can be taken:

(1) Upon generation of correction data, acquisition of data corresponding to a value in image reconstruction data along the encoding axis is performed a plurality of times, and an arithmetic mean thereof is calculated, to improve the S/N ratios.

(2) Among the image reconstruction data, components near a zero-encoding (reading axis) portion having a relatively high S/N ratio are selectively corrected, and no correction is made for components of the surrounding portion having a low S/N ratio.

When method (1) is executed, echo signals are acquired a plurality of times in the following modes described in items (a) to (c), and an arithmetic mean of the resultant data can be calculated.

(a) Echo-signal acquisition is performed in synchronism with respiratory movement and/or cardiac cycles, and echo signals are acquired a plurality of times, at timings of identical phases in these periodical movements.

(b) The respiratory movement is stopped in a given phase, for a predetermined period, and echo signals are repetitively acquired during this interval.

(c) Echo signals are acquired at given intervals over a cycle of the respiratory movement.

When correction data which is obtained based on the echo signals appropriately acquired using the above-mentioned modes is subjected to averaging processing using an arithmetic mean, correction data which is suited for compensating difference of individual patients and for different clinical purposes can thus be generated.

Figure 7:
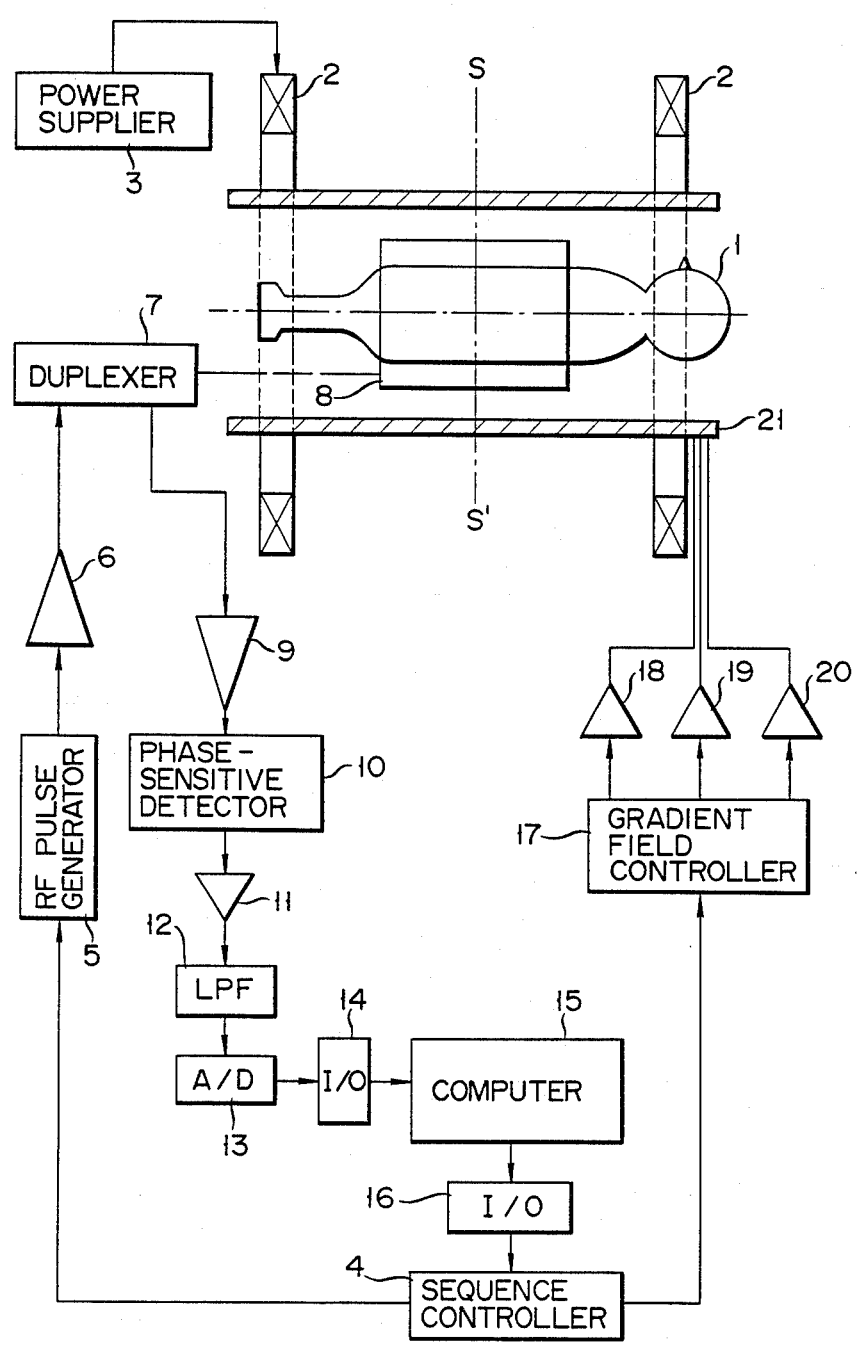
FIG. 7 is a block diagram showing the detailed arrangement of the MRI system according to the first embodiment of the present invention.

FIG. 7 shows the arrangement of the MRI system according to the first embodiment of the present invention, based on the above-mentioned principle. The MRI system shown in FIG. 7 comprises static magnetic field generating coils 2, excitation magnetic field power supplier 3, sequence controller 4, RF pulse generator 5, amplifiers 6, 9, 11, 18, 19, and 20, duplexer 7, transmission/reception coil 8, phase-sensitive detector 10, low-pass filter 12, A/D converter 13, interfaces 14 and 16, computer 15, gradient field controller 17, and gradient field generating coil device 21.

Coils 2 are excited by power supplied from power supplier 3, and generate a uniform static magnetic field in an imaging region of subject (patient) 1. RF pulse generator 5, which is controlled by sequence controller 4, applies RF pulses which have a predetermined frequency and a predetermined envelope. The predetermined envelope corresponds to a rectangular waveform, or Gaussian function-like or sinc function-like waveform. The waveform which is obtained by amplitude-modulating a signal at the predetermined frequency, by the signal of this envelope, corresponds to the waveform of the RF pulses. The RF pulses are amplified to a predetermined level by RF amplifier 6, and are then applied to duplexer 7 as a transmitter/receiver. When the RF pulses are applied to coil 8 from duplexer 7, a rotary magnetic field for exciting an MR phenomenon in object 1 is formed. Transverse magnetization, resulting from the MR phenomenon caused by applying the rotary magnetic field, is detected by coil 8, and an MR signal induced by the transverse magnetization can be derived from two ends of coil 8. In this system, single transmission/reception coil 8 is used both as a transmission coil for generating the rotary magnetic field, and as a reception coil for receiving the MR signal.

The MR signal induced by coil 8 is input to RF amplifier 9 via duplexer 7, and is amplified to a predetermined level. The MR signal amplified by amplifier 9 is detected by phase-sensitive detector 10, so as to be converted to a video-band signal. Detector 10 is a circuit for extracting a component synchronous with a predetermined reference signal. For example, a quadrature detection circuit combining two types of phase-sensitive detectors can be used instead of detector 10. An output signal from detector 10 is voltage-amplified by video amplifier 11, and is then supplied to low-pass filter 12, so as to remove a high-band noise component therefrom. An output signal from low-pass filter 12 is converted to a digital signal by A/D (analog-to-digital) converter 13. An output signal from A/D converter 13 is fetched by computer 15, via interface 14, and is accumulated as image reconstruction data. Computer 15 controls sequence controller 4 via interface 16.

Gradient fields are applied to patient 1, that is, gradient field pulses are applied to him or her, thereby determining the position of a desired slice in patient 1, and the position data relating to the desired slice is converted into the phase of an MR signal. The timing of switching the gradient field is controlled by sequence controller 4.

The intensity and the pulse shape of the gradient field are controlled by gradient field controller 17. Power amplifiers 18, 19, and 20 corresponding respectively to magnetic gradients in x, y, and z directions are controlled by controller 17. Gradient field generating coil device 21 is driven by amplifiers 18, 19, and 20. Device 21 thereby generates any one of specific combinations of various gradient fields, some at the same time, and the others at different times, near the imaging region of patient 1.

The operation for performing correction processing of image reconstruction data, based on the first embodiment of the present invention, will now be described.

Control data is supplied from computer 15 to sequence controller 4 via interface 16. Then, controller 17 performs gradient field control for generating correction data, based on a timing signal generated from sequence controller 4, in accordance with the control data. In this case, the phase-encoding gradient field which was used originally for image reconstruction data acquisition is used as a reading gradient field, and the MR phenomenon is excited without applying the phase-encoding gradient field. An MR signal (echo signal) obtained in this manner is fetched into computer 15 in the same manner as the image reconstruction data, and correction data expressed by formula (1) is generated. Furthermore, the phase and amplitude of the image reconstruction data are corrected using the correction data in accordance with equations (5) and (6). To correct the correction data for compensating the attenuation effect, and/or to perform the averaging processing on the data, sequence controller 4 is controlled by computer 15 through interface 16, thereby to control controller 17. In other words, computer 15 controls sequence controller 4, which in turn controls controller 17 in order to correct the correction data and/or in order to perform the averaging processing.

The first embodiment of the present invention has now been described. Alternatively, the following method will be considered, which permits easier correction processing of image reconstruction data than that in the first embodiment, and can effectively reduce or eliminate degradation in image quality, caused by body movement (for example, a ghost-like artifact) without the need for complex software processing.

In general, the ghost-like artifact can be eliminated by the averaging processing. This artifact is generally influenced particularly by that portion of the image reconstruction data, which occupies the center of the Fourier space. Based on these facts, the data near the reading axis, which yields a zero-encoding value ($|k| \leq K$, $K << N$) is accumulated more times (for example, two or four times more) than the data of the remaining portion, i.e., ($|K| > N$) in order to obtain an arithmetic means. Therefore, the ghost-like artifact can be eliminated without the penalty of a considerably prolonged image reconstruction data acquisition time for obtaining an arithmetic mean. This method is particularly effective when the S/N ratio is sufficiently high and only reduction of the ghost-like artifact is necessary.

If this method is carried out in combination with the phase/amplitude correction processing of image reconstruction data, a more noticeable improvement in image quality can be expected.

The present invention is not limited to the above embodiments.

For example, in the above embodiments, correction data for correcting the phase and amplitude of image reconstruction data is acquired prior to image reconstruction data acquisition. However, the correction data can be acquired at other timings, for example, after image reconstruction data acquisition.

Various other changes and modifications may be made within the spirit and scope of the invention.

What is claimed is:

1. A magnetic resonance imaging system wherein a living subject to be examined is placed in a uniform static magnetic field, a radio frequency field for exciting a magnetic resonance phenomenon, a first gradient field having a magnetic gradient along a first direction, which is used for determining an image slice where the magnetic resonance phenomenon is to be excited, a second gradient field having a magnetic gradient along a second direction, perpendicular to the first direction, which is used for phase-encoding echo information based on the magnetic resonance phenomenon, and a third gradient field having a magnetic gradient along a third direction, perpendicular to the first and second directions, which is used for reading out the echo information based on the magnetic resonance phenomenon, are applied to the object to be examined in the static magnetic field, in a pulse manner and in accordance with a predetermined sequence, so that an echo signal based on the magnetic resonance phenomenon occurring in the subject being examined is acquired, and image reconstruction data including phase and amplitude information is obtained from the echo signal, so as to obtain reconstructed image information, comprising:

correction data generating means which uses the second gradient field for reading out the echo information based on the magnetic resonance phenomenon, and applies the second gradient field, the radio frequency field, and the first gradient field for determining the image slice, to the subject being examined in the static magnetic field, in accordance with the predetermined sequence, without applying a gradient field for phase-encoding the echo information, and acquires the echo signal, so as to extract data corresponding to the image reconstruction data along an encoding axis, thereby obtaining correction data; and correcting means for correcting at least one of a phase and an amplitude of the image reconstruction data, using the correction data obtained by said correction data generating means.

2. A system according to claim 1, wherein said correcting means includes means for obtaining a ratio of a value of the correction data to a value corresponding to the image reconstruction data along the encoding axis, and means for multiplying the ratio by the image reconstruction data, in order to correct the image reconstruction data.

3. A system according to claim 1, wherein said correction data generating means extracts the data, corresponding to the value along the encoding axis, a plurality of times, and uses an arithmetic mean thereof as the correction data.

4. A system according to claim 1, wherein said correcting means selectively corrects components of the image reconstruction data near a reading axis.

5. A system according to claim 1, wherein said correcting means includes means for obtaining a ratio of a value of the correction data to a value corresponding to the image reconstruction data along the encoding axis, and means for multiplying the ratio by the image reconstruction data, in order to correct the image reconstruction data, and said correction data generating means includes echo signal-acquisition means for applying the radio frequency field and the first gradient field for determining the image slice, to the subject being examined in the static magnetic field, in accordance with the predetermined sequence, without applying the gradient field for phase-encoding the echo information and the gradient field for reading out the echo information based on the magnetic resonance phenomenon, so as to obtain the echo signal, and means for correcting the data corresponding to the value along the encoding axis, using an amplitude value which is normalized, using the peak of the echo signal obtained by said echo signal-acquisition means, as 1.

6. A system according to claim 5, wherein said correction data generating means extracts the data, corresponding to the value along the encoding axis, a plurality of times, and uses an arithmetic mean thereof as the correction data.

7. A system according to claim 5, wherein said correcting means corrects components of the image reconstruction data near a reading axis.

8. A magnetic resonance imaging system comprising:
static magnetic field-generating means for applying a uniform static magnetic field to a living subject to be examined;

radio frequency field-generating means for applying, to the subject being examined, a radio frequency field for exciting a magnetic resonance phenomenon;

first gradient field-generating means for applying, to the subject being examined, a first gradient field having a magnetic gradient along a first direction, the first gradient field being used for determining an image slice where the magnetic resonance phenomenon is to be excited;

second gradient field-generating means for applying, to the subject being examined, a second gradient field having a magnetic gradient along a second direction, perpendicular to the first direction, the second gradient field being used for phase-encoding echo information based on the magnetic resonance phenomenon;

third gradient field-generating means for applying, to the subject being examined, a third gradient field having a magnetic gradient along a third direction, perpendicular to the first and second directions, the third gradient field being used for reading out the echo information based on the magnetic resonance phenomenon;

reception means for picking up a magnetic resonance signal produced by the magnetic resonance phenomenon excited in the subject being examined;

magnetic resonance signal-acquiring means which drives said radio frequency field-generating means, and said first, second and third gradient field-generating means in a pulse manner and in accordance with a predetermined sequence, while the static magnetic field is applied to the subject being examined, by said static magnetic field-generating means, in order to apply the gradient fields to the subject being examined in the static magnetic field, thereby exciting the magnetic resonance phenomenon in the subject being examined and acquiring an echo signal based on the magnetic resonance phenomenon; and image-processing means for obtaining image reconstruction data from the echo signal acquired by said magnetic resonance signal-acquiring means, so as to enable reconstructed image information to be obtained, and wherein said magnetic resonance signal-acquiring means selectively acquires the echo signal a plurality of times, for components of the image reconstruction data near a reading axis, and said image-processing means calculates an arithmetic mean of the image reconstruction data, obtained by the plurality of times of echo signal acquisition, and uses the arithmetic mean data for the component of the image reconstruction data near the reading axis.

9. A system according to claim 8, further comprising correction data generating means which uses the second gradient field for reading out the echo information based on the magnetic resonance phenomenon, and applies the second gradient field, the radio frequency field, and the first gradient field for determining the image slice, to the subject being examined in the static magnetic field, in accordance with the predetermined sequence, without applying a gradient field for phase-encoding the echo information, and acquires the echo signal, so as to extract data corresponding to the image reconstruction data along an encoding axis, thereby obtaining correction data; and correcting means for correcting at least one of a phase and an amplitude of the image reconstruction data, using the correction data obtained by said correction data generating means.

10. A system according to claim 9, wherein said correcting means includes means for obtaining a ratio of a value of the correction data to a value corresponding to the image reconstruction data along the encoding axis, and means for multiplying the ratio by the image reconstruction data, in order to correct the image reconstruction data.

11. A system according to claim 9, wherein said correction data generating means extracts the data corresponding to the value along the encoding axis, a plurality of times, and uses an arithmetic mean thereof as the correction data.

12. A system according to claim 9, wherein said correcting means selectively corrects components of the image reconstruction data near a reading axis.

13. A system according to claim 9, wherein said correcting means includes means for obtaining a ratio of a value of the correction data to a value corresponding to the image reconstruction data along the encoding axis, and means for multiplying the ratio by the image reconstruction data, in order to correct the image reconstruction data, and said correction data generating means includes echo signal-acquisition means for applying the radio frequency field and the first gradient field for determining the image slice, to the subject being examined in the static magnetic field, in accordance with the predetermined sequence, without applying the gradient field for phase-encoding the echo information and that for reading out the echo information based on the magnetic resonance phenomenon, so as to obtain the echo signal, and means for correcting the data corresponding to the value along the encoding axis, using an amplitude value which is normalized, using the peak of the echo signal obtained by said echo signal-acquisition means, as 1.

14. A system according to claim 13, wherein said correction data generating means extracts the data corresponding to the value along the encoding axis, a plurality of times, and uses an arithmetic mean thereof as the correction data.

15. A system according to claim 13, wherein said correcting means corrects components of the image reconstruction data near a reading axis.

* * * * *